United States Patent
Jones

(10) Patent No.: US 10,916,926 B2
(45) Date of Patent: Feb. 9, 2021

(54) FIREPROOF AIRTIGHT ELECTRICAL BOX

(71) Applicant: Warren W. Jones, Chilliwack (CA)

(72) Inventor: Warren W. Jones, Chilliwack (CA)

(*) Notice: Subject to any disclaimer, the term of this patent is extended or adjusted under 35 U.S.C. 154(b) by 198 days.

(21) Appl. No.: 16/283,881

(22) Filed: Feb. 25, 2019

(65) Prior Publication Data
US 2019/0273370 A1 Sep. 5, 2019

Related U.S. Application Data

(60) Provisional application No. 62/636,950, filed on Mar. 1, 2018.

(51) Int. Cl.
| | | |
|---|---|---|
| H02G 3/08 | (2006.01) | |
| H05K 5/06 | (2006.01) | |
| H02G 3/12 | (2006.01) | |
| H02G 3/04 | (2006.01) | |

(52) U.S. Cl.
CPC ............ *H02G 3/088* (2013.01); *H02G 3/123* (2013.01); *H02G 3/126* (2013.01); *H05K 5/06* (2013.01); *H02G 3/0412* (2013.01)

(58) Field of Classification Search
CPC .......... H02G 3/08; H02G 3/081; H02G 3/088; H02G 3/123; H02G 3/126; H02G 3/0412; H05K 5/06; H05K 5/061; H05K 7/00
USPC ................ 174/50, 53, 57, 58, 480, 481; 220/3.2–3.9, 4.02
See application file for complete search history.

(56) References Cited

U.S. PATENT DOCUMENTS

| | | | | |
|---|---|---|---|---|
| 4,408,695 A * | 10/1983 | Balkwill | ............... | H02G 3/088 174/57 |
| 4,952,754 A * | 8/1990 | Rye | ............... | H02G 3/088 174/53 |
| 4,988,832 A * | 1/1991 | Shotey | ............... | H02G 3/088 174/53 |
| 6,395,984 B1 * | 5/2002 | Gilleran | ............... | H02G 3/088 174/50 |
| 7,087,837 B1 * | 8/2006 | Gretz | ............... | H02G 3/121 174/53 |
| 7,423,217 B2 * | 9/2008 | Pape | ............... | H02G 3/088 16/2.1 |
| 7,645,937 B2 * | 1/2010 | Bhosale | ............... | H02G 3/14 174/58 |
| 7,935,886 B2 * | 5/2011 | Jafari | ............... | H02G 3/123 174/58 |
| 9,362,729 B2 * | 6/2016 | Wade | ............... | H02G 3/10 |
| 9,583,924 B2 * | 2/2017 | Thornton | ............ | H01R 13/5213 |
| 10,651,638 B1 * | 5/2020 | Schad | ............... | H02G 3/081 |

* cited by examiner

*Primary Examiner* — Angel R Estrada

(57) ABSTRACT

Disclosed is a fireproof airtight electrical box. The disclosed fireproof airtight electrical box includes a metal gang box to which is attached a sealing mechanism which will allow the gang box device to form at least a hermetic, preferably air-tight, seal within a larger structure, while at the same time being suitable for use within such a structure because of the stiffness, strength, and at least fire resistant qualities.

18 Claims, 6 Drawing Sheets

FIREPROOF AIRTIGHT ELECTRICAL BOX

CROSS-REFERENCE TO RELATED PATENT DOCUMENTS

This patent application claims the benefit of priority of U.S. Provisional Application No. 62/636,950, entitled "FIREPROOF AIRTIGHT ELECTRICAL BOX," filed Mar. 1, 2018, which are hereby incorporated herein by reference in its entirety.

FIELD OF THE INVENTION

The present invention relates generally to electrical devices, and, more particularly, to a fireproof airtight electrical box.

BACKGROUND

Electrical current boxes providing a relatively airtight seal against oversized opening has long been a focus in the electrical industry. It is well-known that a significant amount of attention is paid to making structures more efficient, meaning less energy is required to heat or cool a structure. In addressing this problem, one or more ideas have been put forth, including using a separate gang box made of a plastic wall, a flange, and a vapor barrier to the box. For example, the patented method, as shown in U.S. Pat. No. 6,239,365, relates to a gang box made of a single structure whereby a flange is included to seal the vapor barrier. Whereas the invention, such as in U.S. Pat. No. 6,239,365, has been shown to have some success, the inventions have by and large focused on single family structures and smaller structures, wherein it is possible to use polymer-based gang boxes. The benefits of using such material for gang boxes are that they can be easily molded and shaped to match a particular opening or fit within a wall. Furthermore, such material, when acting in situ, the gang box adjusts to fit the environment.

However, issue with such materials for the gang boxes is their inappropriateness for use in high structures, for example, buildings above 6 storeys. Aside from being required by modern building codes, the polymer-based gang boxes do not have the ability to sufficiently contain a fire that may result from wire attachments. Such is a risk to the entire building structure. Further, larger buildings require sufficient "hold" by the various elements that make up the structure, which includes sufficient stiffness and strength from the gang boxes, that are used in the walls. This accounts from the different variables that affect larger structures, including winds and weight deriving from the additional levels. The polymer-based gang boxes cannot provide sufficient stiffness and strength necessary to support larger building structures.

Steel and heavy metal boxes are recommended and required for the larger building structures. However, the use of metal in terms of molding it with a material suitable for creating an airtight seal, which in many instances is a polymer product, is not simple. In most instances, creating a "one piece" structure wherein metal forms the gang box is performed by physically attaching the seal to the metal gang box, for example, via screws.

In light of the foregoing, there exists a need for a technical and reliable solution that solves the above-mentioned problems and presents an improved electrical box that offers air-tight sealing for a larger building structure.

BRIEF SUMMARY

It is an objective of the present invention to provide a fireproof airtight electrical box. The present invention relates to a metal gang box to which is attached a sealing mechanism which will allow the gang box device to form at least a hermetic, preferably air-tight, seal within a larger structure, while at the same time being suitable for use within such a structure because of the stiffness, strength, and at least fire resistant qualities.

In an embodiment, the fireproof airtight electrical box comprises a gang box having a head and a body. A diameter of the head is greater than a diameter of the body. In an embodiment, the fireproof airtight electrical box further comprises a polymer gasket having a cut out that allows the polymer gasket to fit over the body of the gang box. In an embodiment, the fireproof airtight electrical box further comprises a metal flange having a cut out that allows the metal flange to fit over the body of the gang box.

In an embodiment, the polymer gasket may be positioned between back of the head of the gang box and the metal flange, and the metal flange may be positioned against the polymer gasket. In and embodiment, the head is larger than 0.5" to 1" on each side of the body, and a width of the head from a front of the gang box may vary from 0.25" to 1". In an embodiment, the polymer gasket may vary from 0.25" to 1" in thickness. In an embodiment, each of the polymer gasket and the metal flange includes one or more holes that are equally matched to each other. The one or more holes may allow the gang box including the polymer gasket and the metal flange to be secured on a plane surface such as wall.

These and other features and advantages of the present invention will become apparent from the detailed description below, in light of the accompanying drawings.

BRIEF DESCRIPTION OF THE ACCOMPANYING DRAWINGS

The novel features which are believed to be characteristic of the present invention, as to its structure, organization, use and method of operation, together with further objectives and advantages thereof, will be better understood from the following drawings in which a presently preferred embodiment of the invention will now be illustrated by way of various examples. It is expressly understood, however, that the drawings are for the purpose of illustration and description only and are not intended as a definition of the limits of the invention. Embodiments of this invention will now be described by way of example in association with the accompanying drawings in which:

Figure 1:
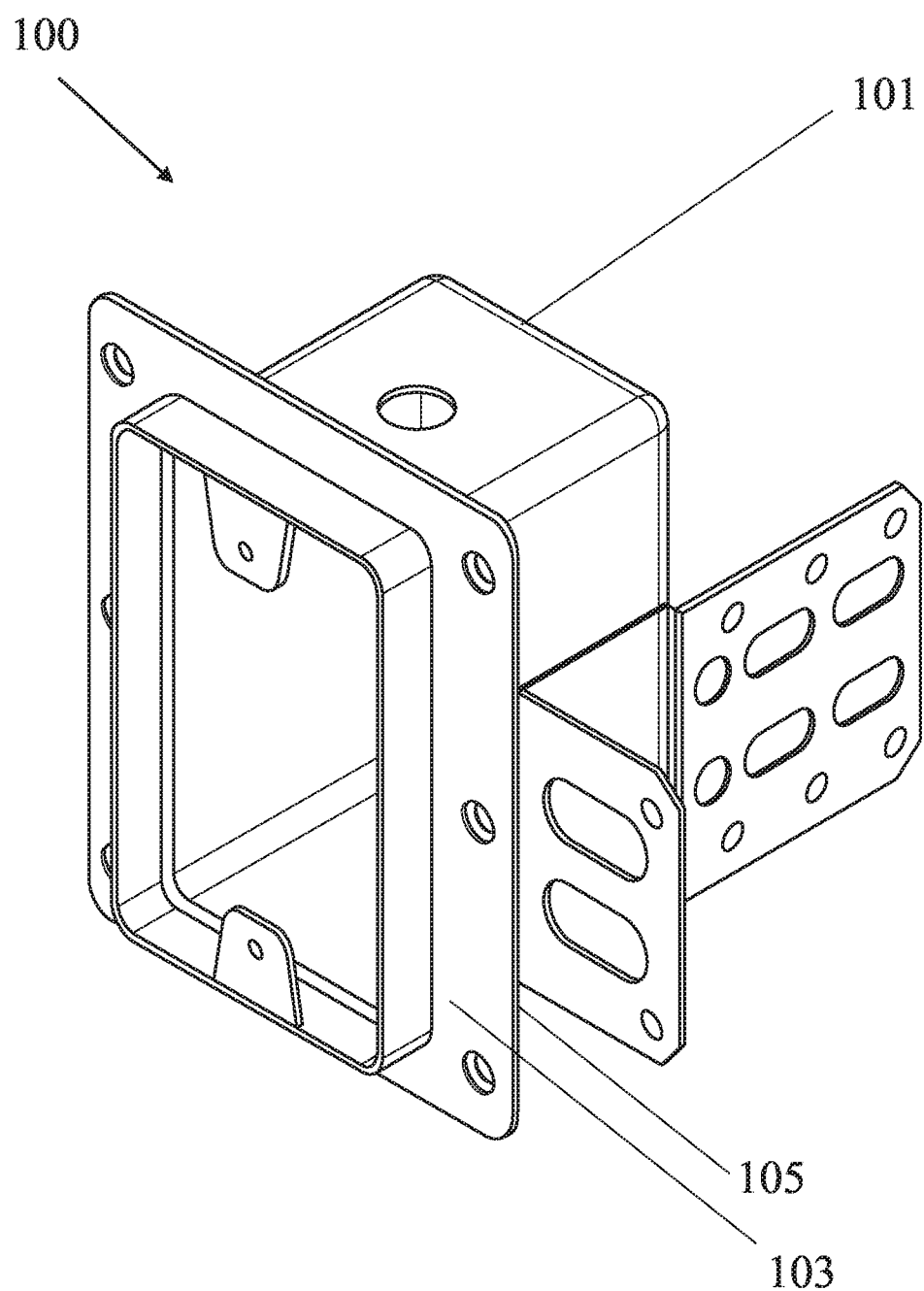
FIG. 1 shows a top perspective view of a combined unit of a fireproof airtight electrical box from its frontside, in accordance with an embodiment of the present invention.

Further areas of applicability of the present invention will become apparent from the detailed description provided hereinafter. It should be understood that the detailed description of exemplary embodiments is intended for illustration purposes only and is, therefore, not intended to necessarily limit the scope of the invention.

DETAILED DESCRIPTION

As used in the specification and claims, the singular forms "a", "an" and "the" may also include plural references. For example, the term "an article" may include a plurality of articles. Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention. There may be additional components described in the foregoing application that are not depicted on one of the described drawings. In the event such a component is described, but not depicted in a drawing, the absence of such a drawing should not be considered as an omission of such design from the specification.

Before describing the present invention in detail, it should be observed that the present invention utilizes a combination of components, which constitutes a fireproof airtight electrical box. Accordingly, the components have been represented, showing only specific details that are pertinent for understanding of the present invention so as not to obscure the disclosure with details that will be readily apparent to those with ordinary skill in the art having the benefit of the description herein. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

References to "one embodiment", "an embodiment", "another embodiment", "yet another embodiment", "one example", "an example", "another example", "yet another example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

The words "comprising", "having", "containing", and "including", and other forms thereof, are intended to be equivalent in meaning and be open ended in that an item or items following any one of these words is not meant to be an exhaustive listing of such item or items or meant to be limited to only the listed item or items.

Techniques consistent with the present invention provide, among other features, a fireproof airtight electrical box including at least a metal gang box to which is attached a sealing mechanism. Unless stated otherwise, terms such as "first" and "second" are used to arbitrarily distinguish between the elements or entities. Thus, these terms are not necessarily intended to indicate temporal or other prioritization of such elements or priorities. While various exemplary embodiments of the disclosed systems and methods have been described above, it should be understood that they have been presented for purposes of example only, and not limitations. It is not exhaustive and does not limit the invention to the precise form disclosed. Modifications and variations are possible in light of the above teachings or may be acquired from practicing of the invention, without departing from the breadth or scope.

It will be readily understood that the components of the embodiments as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, etc. In other instances, well-known structures, materials, or operations are not shown or described in detail to avoid obfuscation. The following description is intended only by way of example, and simply illustrates certain example embodiments.

The fireproof airtight electrical box will now be described with reference to the accompanying drawings, which should be regarded as merely illustrative without restricting the scope and ambit of the present invention.

FIG. 1 shows a top perspective view of a combined unit of the fireproof airtight electrical box 100 from its frontside, in accordance with an embodiment of the present invention. The fireproof airtight electrical box 100 includes at least a gang box 101, a polymer gasket 103, and a metal flange 105.

The gang box 101 is made of a metal, and the gang box 101 has a wider diameter at its head than at its body. The polymer gasket 103 has an inner diameter slightly larger than the body of the gang box 101 but smaller than the head of the gang box 101. The metal flange 105 at least matches the size of the polymer gasket 103.

In an exemplary embodiment, the metal for the gang box 101 is preferably an alloy that is fireproof, such as steel comprising at least an amount of iron and an amount of carbon. In a preferred embodiment, the steel may include an amount of chromium, making the steel a stainless material that is capable of withstanding corrosion. In another exemplary embodiment, the metal for the gang box 101 may also be galvanized steel. The galvanized steel is steel that has been coated in zinc to make it corrosion resistant. The gang box 101, being comprised of steel, is at least a fire-resistant box, and in a preferred embodiment, a fire-proof box.

In some embodiments, the gang box 101 may be used for switches or outlets. In some embodiments, the gang box 101 may be used as a small junction box. Its body is made from one piece of cold drawn or stamped steel. In still further embodiments, the gang box 101 is made from flat steel plates that may have interlocking tabs and/or spot welds holding them together. They cannot be taken apart and are not gangable. The gang box 101 may be available in single gang, 2 gang, 3 gang, 4 gang, 5 gang, 6 gang, square, or octagon box sizes. In some embodiments, these gang boxes may come with a tab or bracket attached to one side for fastening the boxes to a wood stud or a metal stud when using the boxes in single or multiple gang box configurations.

In an embodiment, the gang box 101 of the present invention may include a head, wherein the head has a diameter larger than the base of the gang box 101. In one specific embodiment, the head is 0.5" to 1" larger on all four sides than the base of the gang box 101. In use, the gang box 101 may be inserted into a wall opening slightly larger in diameter than the box's body, but smaller than the diameter of the head of the gang box 101.

In an embodiment, the polymer gasket 103 used in the present invention is positioned between the head of the gang box 101 and the metal flange 105. The polymer gasket 103 has a cut out that allows it to fit over the body of the gang box 101. In an exemplary embodiment, the polymer gasket 103 is made of any suitable type of fireproof sealing element. Examples of the sealing element may include, but are not limited to, polymer, plastic, metal, rubber, or foam that may be fireproof. In a specific embodiment of the present invention, the polymer gasket 103 is preferably made of a fireproof foam material or a fireproof polymer material. For example, the polymer gasket 103 may be made of polyurethane foam, polystyrene, phenolic foam, or other fireproof manufactured foam. The polymer gasket 103 is sized such that it fits over the body of the gang box 101 but is smaller than the head of the gang box 101. In a preferred embodiment, the polymer gasket 103 fits tightly over the head of the gang box 101. For example, the polymer gasket 103 is configured to seal the interior of the gang box 101 from any exterior elements when a bracket such as an adapter or frame is coupled to the gang box 101. The polymer gasket 103 may also include one or more grooves such as along a frontside or a backside of the polymer gasket 103. The polymer gasket 103 may also include one or more inner or outer rims.

In an embodiment, the metal flange 105 used in the present invention is positioned against the polymer gasket 103. In an exemplary embodiment, the metal flange 105 may be made of a metal alloy, such as steel comprised of iron and carbon. In a preferred embodiment, the metal flange 105 may include chromium, in which the metal flange 105 is resistant or stainless. In one exemplary embodiment, the metal flange 105 may be made of the same material as the body of the gang box 101. The metal flange 105 has a cut out allowing it to fit over the body of the gang box 101. The metal flange 105 is sized such that it fits over the body of the gang box 101 but is smaller than the head of the gang box 101. In a preferred embodiment, the polymer gasket 103 fits tightly over the head of the gang box 101.

Figure 2:
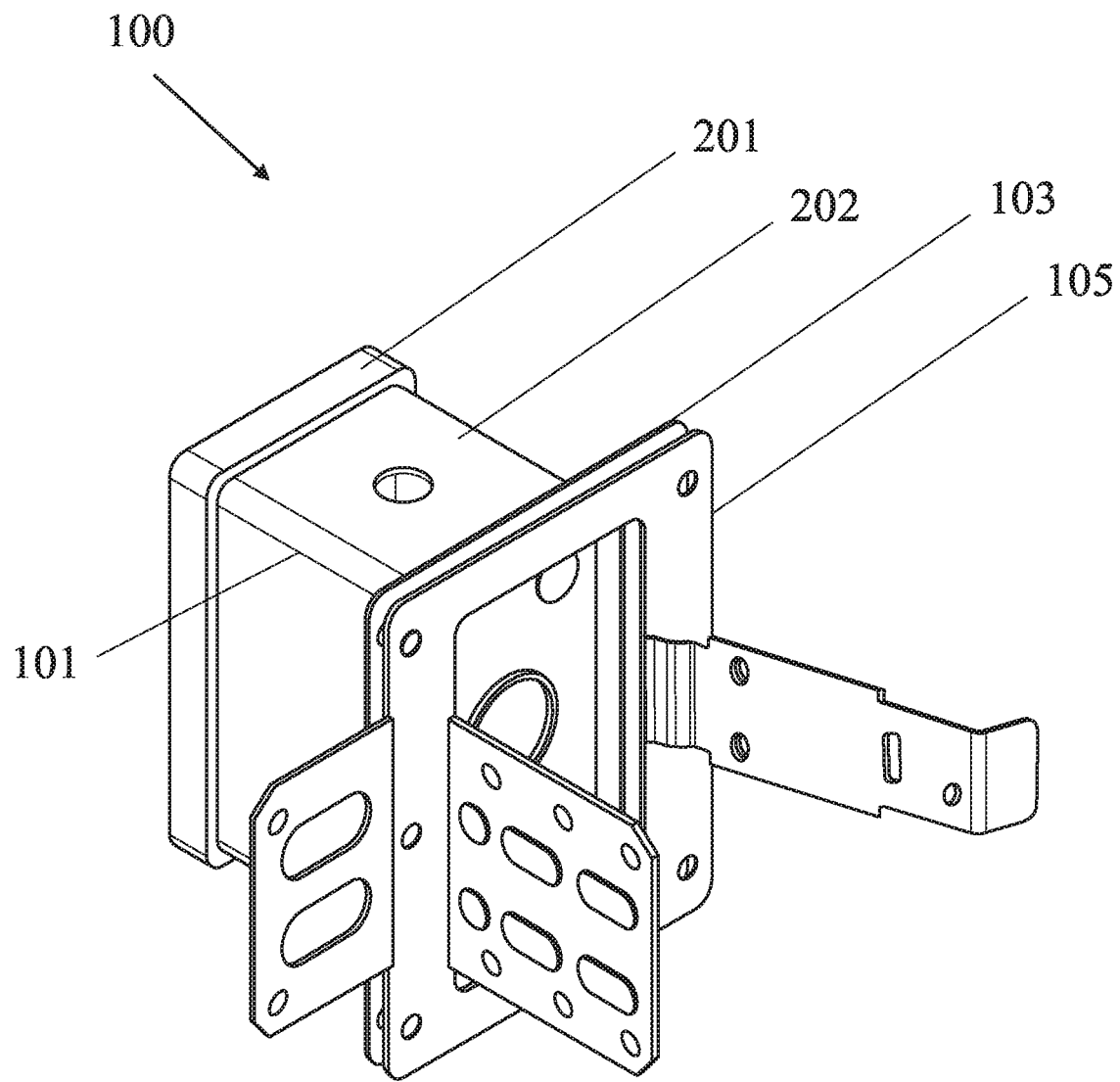
FIG. 2 shows a top perspective view of an exploded fireproof airtight electrical box from its backside, in accordance with an embodiment of the present invention.

FIG. 2 shows a top perspective view of an exploded fireproof airtight electrical box 100 from its backside, in accordance with an embodiment of the present invention. As shown in FIG. 2, the gang box 101 includes a head 201 and a body 202. The head 201 has an overall diameter larger than the body 202. In an embodiment, the head 201 is larger than 0.5" to 1" on each side than the body 202. In an embodiment, the width of the head 201 from the front of the gang box 101 may vary from 0.25" to 1".

In FIG. 2, also shown is the polymer gasket 103 and the metal flange 105. The polymer gasket 103 is positioned between the back of the head 201 and the metal flange 105. The polymer gasket 103 is preferably a fireproof manufactured foam, as previously described. The polymer gasket 103 may be from 0.25" to 1" in thickness. The polymer gasket 103 should form a tight seal against the body 202 of the gang box 101, as well as against the head 201 of the gang box 101.

As will be discussed later, the polymer gasket 103 and the metal flange 105 possess a number of holes, equally matched to each other, which allows the gang box 101 including the polymer gasket 103 and the metal flange 105 to be secured on a plane surface such as a wall, a wooden board, a metal board, or the like. As provided during installation, the polymer gasket 103 and the metal flange 105 are pre-attached to the gang box 101. An end-user, for example, an electrician or installer may not be required to install the polymer gasket 103 or the metal flange 105 prior to installing the gang box 101.

Figure 3:
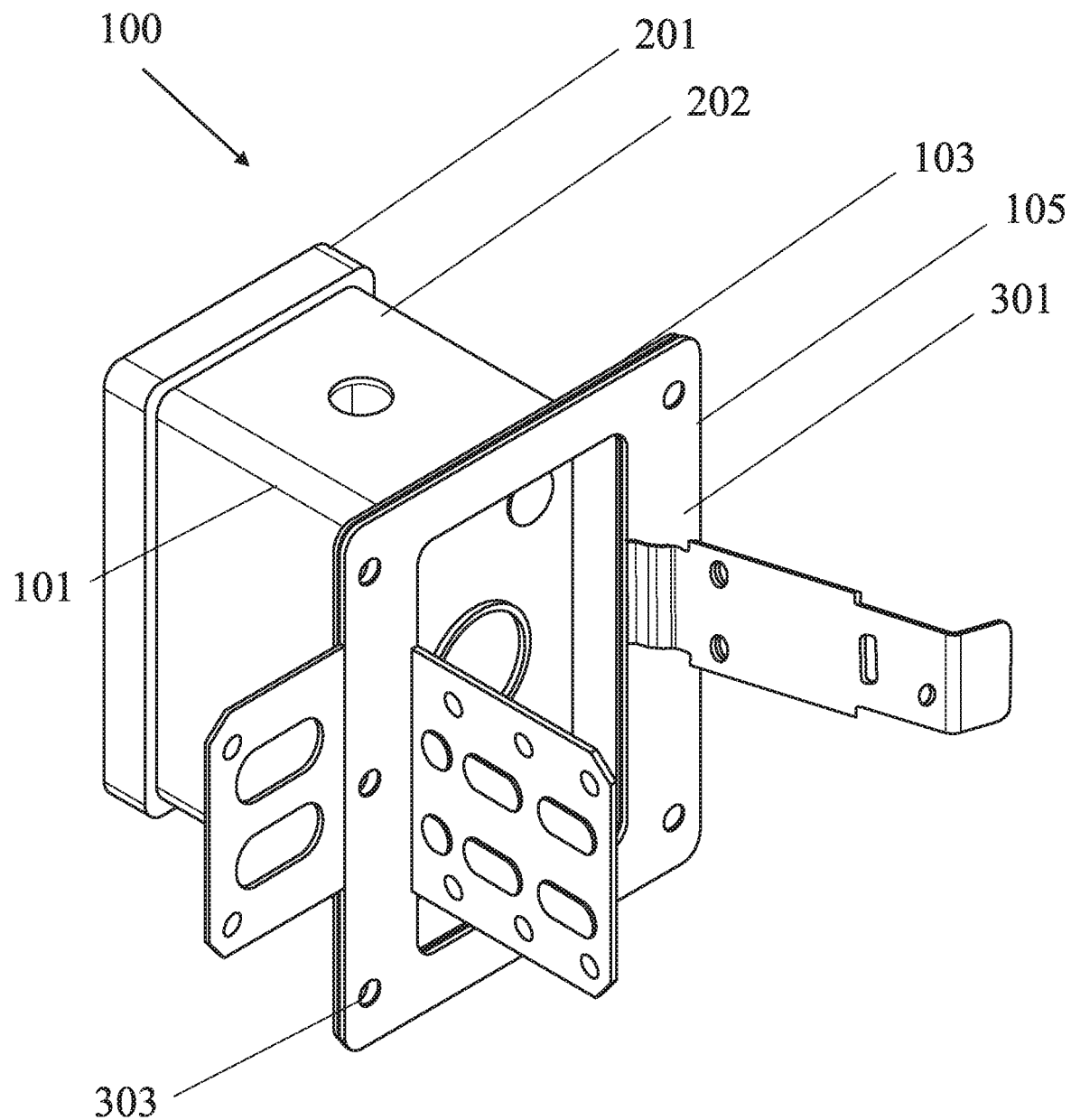
FIG. 3 shows a top perspective view of a partially exploded fireproof airtight electrical box from its backside, in accordance with an embodiment of the present invention.

FIG. 3 shows a top perspective view of a partially exploded fireproof airtight electrical box 100 from its backside, in accordance with an embodiment of the present invention. As shown in FIG. 3, the gang box 101 includes the head 201 and the body 202. There is further shown the polymer gasket 103 and the metal flange 105 as a combination 301 of the polymer gasket/metal flange combination. There is further shown one or more holes such as a hole 303.

As shown in FIG. 3 of the present invention, the gang box 101 is separated from the polymer gasket/metal flange combination 301. In this embodiment, it is clear that the combination 301 contains at least one hole 303 allowing it to be secured to a wall surface (not shown). In an embodiment, each of the polymer gasket 103 and the metal flange 105 includes the one or more holes (such as the hole 303). Further, the number of holes in the polymer gasket 103 is the same as the number of holes in the metal flange 105. The one or more holes are positioned in a manner that when the polymer gasket 103 and the metal flange 105 are combined to form the combination 301, the one or more holes of the polymer gasket 103 overlaps with the one or more holes of the metal flange 105. Upon insertion on the gang box 101, the combination 301 will be forward such that it is adjacent to the head 201 of the gang box 101.

Figure 4:
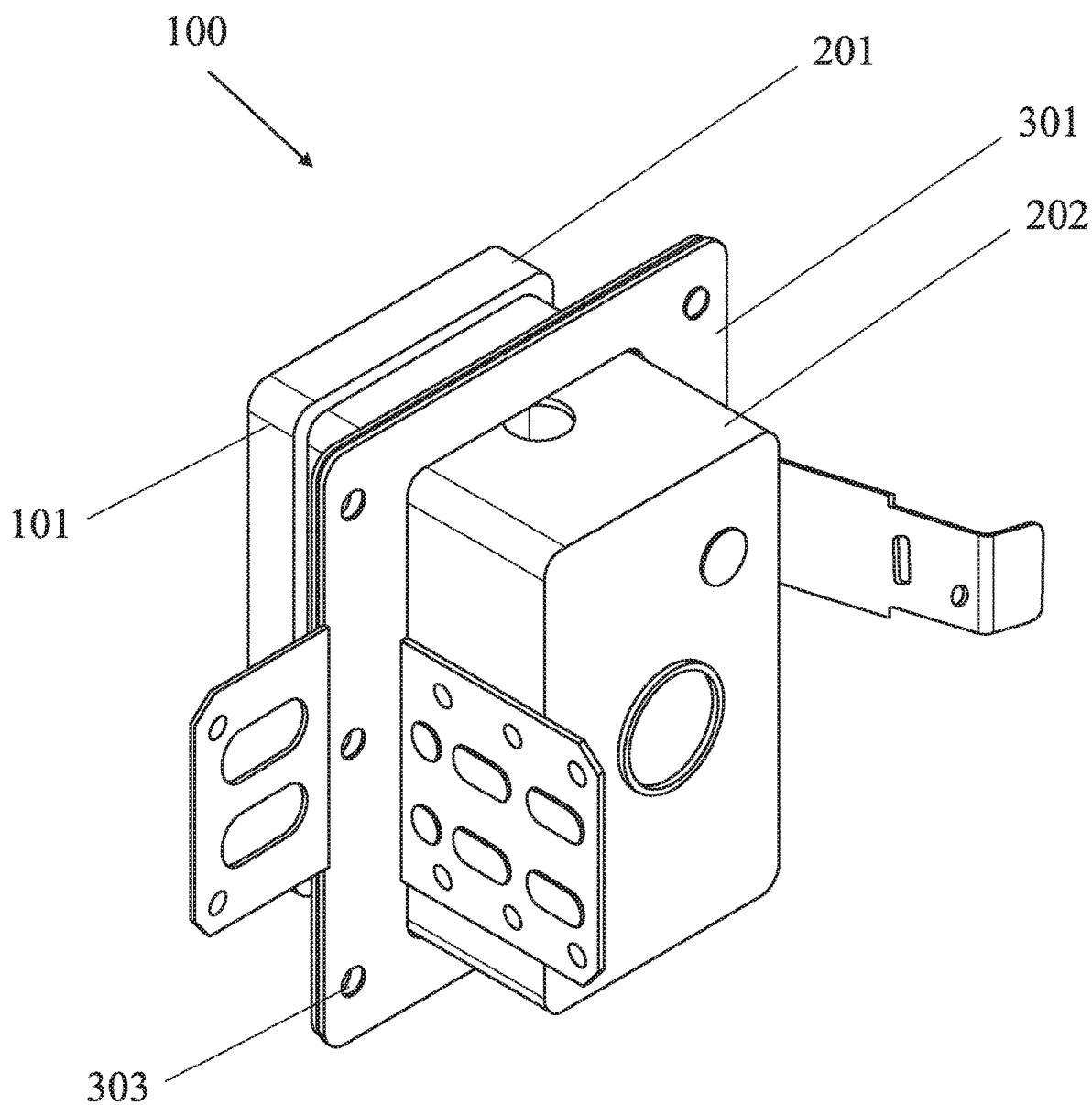
FIG. 4 shows a top perspective view of the combined unit of the fireproof airtight electrical box from its backside, in accordance with an embodiment of the present invention.

FIG. 4 shows a top perspective view of the combined unit of the fireproof airtight electrical box 100 from its backside, in accordance with an embodiment of the present invention. As shown in FIG. 4, the gang box 101 includes the head 201 and the body 202. There is further shown the combination 301 of the polymer gasket 103 and the metal flange 105. There is further shown the one or more holes such as the hole 303. FIG. 4 exhibits the combination 301 being pushed onto the gang box 101 such that it is adjacent to the head 201 of the gang box 101.

Figure 5:
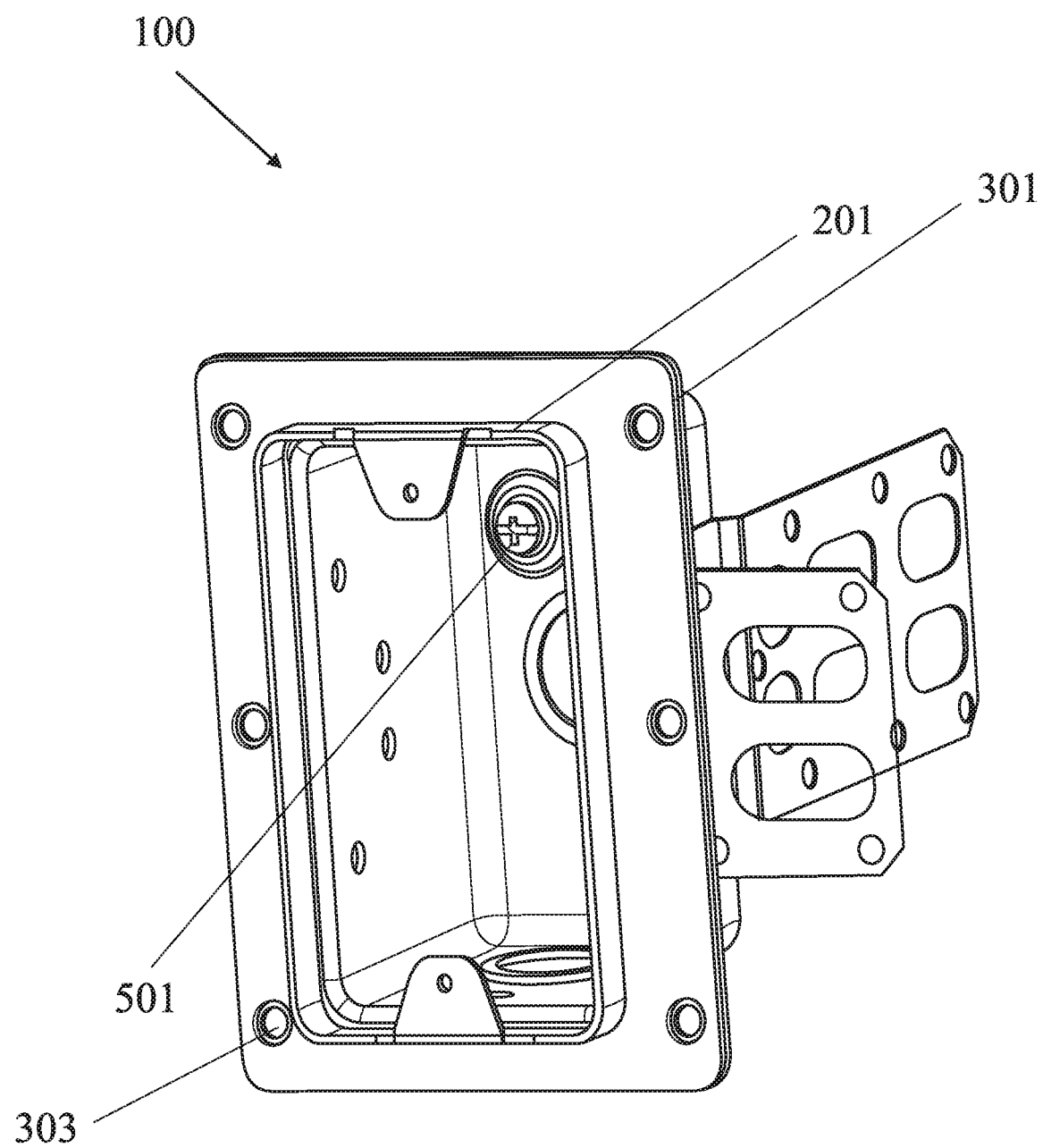
FIG. 5 shows a front view of the combined unit of the fireproof airtight electrical box from its frontside, in accordance with an embodiment of the present invention.

FIG. 5 shows a front view of the combined unit of the fireproof airtight electrical box from 100 its frontside, in accordance with an embodiment of the present invention. In FIG. 5, there is shown the head 201 of the gang box 101 and the combination 301 of the polymer gasket 103 and the metal flange 105. The combination 301 includes the one or more holes such as the hole 303. There is further shown a ground screw 501 (in FIG. 5) that is inserted or tighten inside the gang box 101. The ground screw 501 may also have a fireproof rubber or foam washer that is positioned on the back of the ground screw 501. The ground screw 501 may also have another fireproof rubber or foam washer fixed to the gang box 101 to allow for air sealing. The ground screw 501 may be fitted from inside of the gang box 101.

Figure 6:
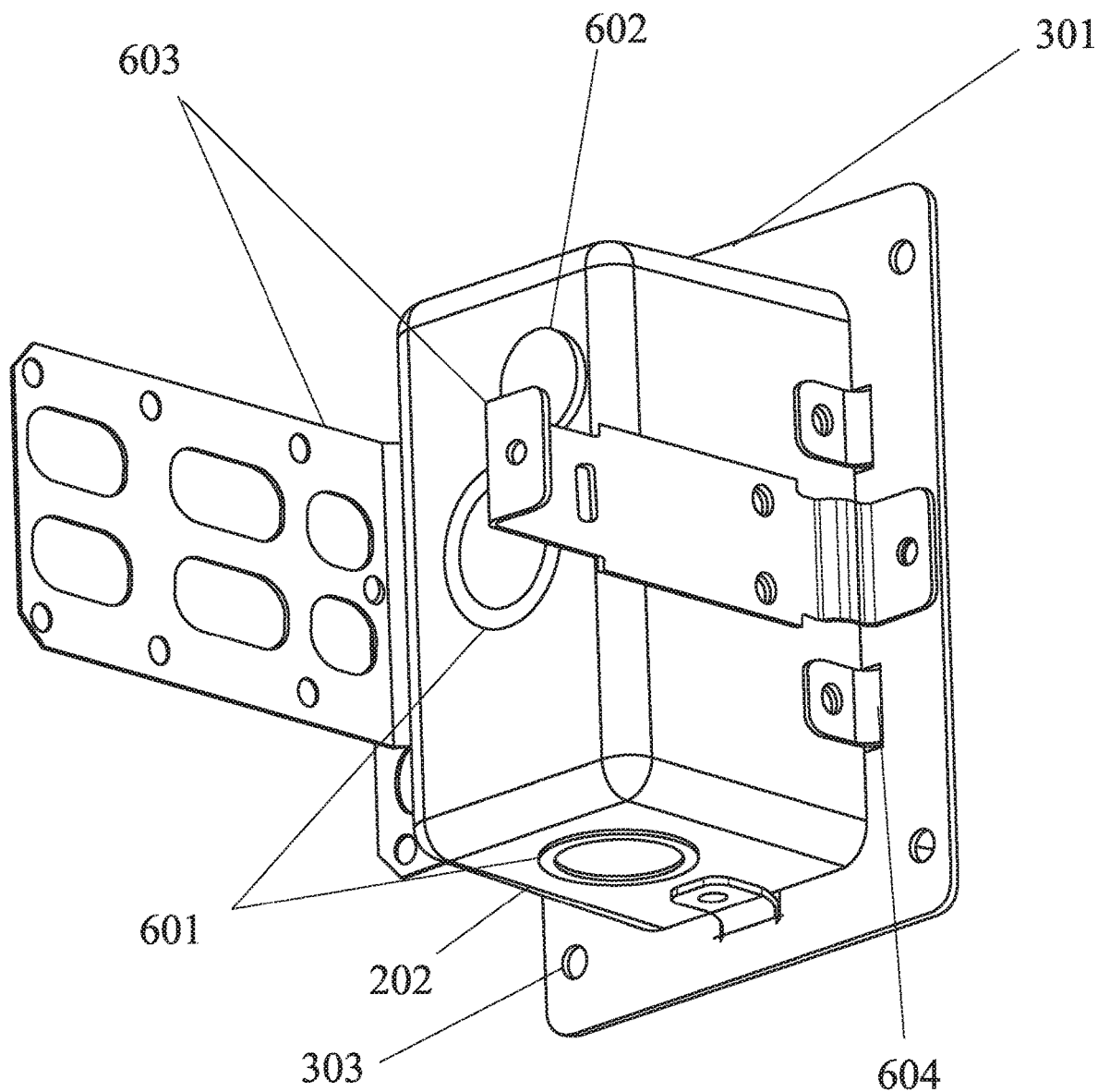
FIG. 6 shows a bottom perspective view of the combined unit of the fireproof airtight electrical box from its backside, in accordance with an embodiment of the present invention.

FIG. 6 shows a bottom perspective view of the combined unit of the fireproof airtight electrical box 100 from its backside, in accordance with an embodiment of the present invention. In FIG. 6, there is shown the body 202 of the gang box 101 and the combination 301 of the polymer gasket 103 and the metal flange 105. The combination 301 includes the one or more holes such as the hole 303. There is further shown fireproof rubber or foam inserts 601, a fireproof rubber or foam cover 602, metallic brackets 603, and metallic flanges such as a metallic flange 604.

In an embodiment, the fireproof rubber or foam inserts 601 has been included (as shown in FIG. 6) to air seal between the knockouts and the gang box 101. In an embodiment, the fireproof rubber or foam cover 602 has been included (as shown in FIG. 6) to air seal the ground screw hole. In an embodiment, the metallic brackets 603 has been included to secure around studs. In an embodiment, the metallic flange 604 can either be press fit or secured to the gang box 101 by grommets.

Thus, the disclosed fireproof airtight electrical box 100 includes the metal gang box to which is attached a sealing mechanism which allows the gang box device to form at least a hermetic, preferably air-tight, seal within a larger structure, while at the same time being suitable for use within such a structure because of the stiffness, strength, and at least fire resistant qualities.

Although particular embodiments of the invention have been described in detail for purposes of illustration, various modifications and enhancements may be made without departing from the spirit and scope of the invention.

What is claimed is:

1. An electrical box, comprising:
 a gang box having a head and a body, wherein a diameter of said head is greater than a diameter of said body;
 a polymer gasket having a cut out that allows said polymer gasket to fit over said body of said gang box; and
 a metal flange having a cut out that allows said metal flange to fit over said body of said gang box,
  wherein said polymer gasket is positioned between back of said head of said gang box and said metal flange, and wherein said metal flange is positioned against said polymer gasket.

2. The electrical box of claim 1, wherein said gang box is made of an alloy that is fireproof.

3. The electrical box of claim 2, wherein said alloy corresponds to steel comprising an amount of iron, an amount of carbon, and an amount of chromium.

4. The electrical box of claim 3, wherein said steel is coated in zinc to make it corrosion resistant.

5. The electrical box of claim 1, wherein said polymer gasket has an inner diameter larger than said diameter of said body of said gang box and smaller than said diameter of said head of said gang box.

6. The electrical box of claim 5, wherein said polymer gasket is made of a fireproof sealing element comprising at least one of plastic, metal, rubber, or foam.

7. The electrical box of claim 6, wherein said polymer gasket is sized such that said polymer gasket fits over said body of said gang box but is smaller than said head of said gang box.

8. The electrical box of claim 6, wherein said polymer gasket is sized such that said polymer gasket fits tightly over said head of said gang box.

9. The electrical box of claim 8, wherein said polymer gasket is configured to seal interior of said gang box from any exterior elements when a bracket such as an adapter or frame is coupled to said gang box.

10. The electrical box of claim 1, wherein said metal flange is made of a metal alloy comprising at least iron, carbon, and chromium.

11. The electrical box of claim 10, wherein said metal flange is sized such that said metal flange fits over said body of said gang box but is smaller than said head of said gang box.

12. The electrical box of claim 10, wherein said metal flange is sized such that said metal flange fits tightly over said head of said gang box.

13. The electrical box of claim 1, wherein said head is larger than 0.5" to 1" on each side than said body, and wherein a width of said head from a front of said gang box varies from 0.25" to 1".

14. The electrical box of claim 1, wherein said polymer gasket varies from 0.25" to 1" in thickness, and wherein said polymer gasket forms airtight seal against said body and said head of said gang box.

15. The electrical box of claim 1, wherein said polymer gasket and said metal flange includes one or more holes, equally matched to each other, which allows said gang box including said polymer gasket and said metal flange to be secured on a plane surface.

16. The electrical box of claim 1, further comprising a ground screw that is positioned and fitted from inside of said gang box to allow for air sealing.

17. The electrical box of claim 16, further comprising fireproof rubber or foam inserts to air seal between knockouts and said gang box.

18. The electrical box of claim 17, further comprising fireproof rubber or foam cover to air seal ground screw hole associated with said ground screw.

* * * * *